United States Patent
Pantel et al.

(10) Patent No.: US 12,294,373 B2
(45) Date of Patent: May 6, 2025

(54) METHOD FOR TRANSFERRING A CONTROL SIGNAL BETWEEN A FIRST DIGITAL DOMAIN AND A SECOND DIGITAL DOMAIN, AND CORRESPONDING SYSTEM-ON-A-CHIP

(71) Applicant: STMicroelectronics International N.V., Geneva (CH)

(72) Inventors: Joran Pantel, Marseilles (FR); Daniel Olson, Austin, TX (US)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/516,660

(22) Filed: Nov. 21, 2023

(65) Prior Publication Data
US 2024/0178823 A1    May 30, 2024

(30) Foreign Application Priority Data
Nov. 29, 2022    (FR) ........................... 2212496

(51) Int. Cl.
*H03K 5/05*      (2006.01)
*H03K 19/0175*   (2006.01)

(52) U.S. Cl.
CPC ....... *H03K 5/05* (2013.01); *H03K 19/017509* (2013.01)

(58) Field of Classification Search
CPC .............................. H03K 5/05; H03K 19/0175
USPC ............................................ 326/63; 327/333
See application file for complete search history.

(56) References Cited

U.S. PATENT DOCUMENTS

| 4,501,974 A | 2/1985 | Miller et al. | |
|---|---|---|---|
| 6,247,082 B1* | 6/2001 | Lo | G06F 13/405 710/105 |
| 2023/0325336 A1* | 10/2023 | Saux | G06F 13/405 713/400 |

FOREIGN PATENT DOCUMENTS

| CN | 112202424 A | 1/2021 |
|---|---|---|
| EP | 3866340 A1 | 8/2021 |

OTHER PUBLICATIONS

INPI Search Report and Written Opinion for priority application, FR 2212496, report dated Jul. 12, 2023, 10 pgs.

\* cited by examiner

*Primary Examiner* — William Hernandez
(74) *Attorney, Agent, or Firm* — Crowe & Dunlevy LLC

(57) ABSTRACT

A system-on-a-chip includes a first digital domain and a second digital domain. An interface circuit includes a level-shifting circuit for converting a signal between the first digital domain and the second digital domain. The first digital domain includes a control circuit configured to generate a control signal for transmission to the second digital domain. The control signal includes a pulse having a nominal duration adapted to the level-shifting circuit. At the input of the level-shifting circuit, the interface circuit includes, in the first domain, a conditional pulse-stretching circuit that lengthens a duration of the pulse of the control signal to at least the nominal duration when a duration of the pulse of the control signal is shorter than the nominal duration and non-zero.

15 Claims, 3 Drawing Sheets

METHOD FOR TRANSFERRING A CONTROL SIGNAL BETWEEN A FIRST DIGITAL DOMAIN AND A SECOND DIGITAL DOMAIN, AND CORRESPONDING SYSTEM-ON-A-CHIP

PRIORITY CLAIM

This application claims the priority benefit of French Application for Patent No. 2212496, filed on Nov. 29, 2022, the content of which is hereby incorporated by reference in its entirety to the maximum extent allowable by law.

TECHNICAL FIELD

Embodiments and implementations relate to the transfer of signals, such as control signals and data, between separate digital domains of a system-on-a-chip, in particular digital domains with different power supply voltages and operating frequencies.

BACKGROUND

U.S. patent application Ser. No. 18/133,214 (corresponding to French Application for Patent No. 2203375 filed Apr. 12, 2022; incorporated herein by reference) describes a method, and a corresponding system-on-a-chip, for transferring data between a first digital domain and a second digital domain, allowing data corruption caused by metastability in a register used for the transfer, for example metastability caused by an asynchronous external reset, to be prevented.

In particular, the foregoing reference describes a generation of a control signal, by a pulse-stretching circuit configured to generate a pulse having a duration that is long enough to pass through a voltage level-shifting circuit, from a pulse generated in the first digital domain and having a duration that corresponds to, for example, a clock cycle of the first digital domain.

More specifically, voltage level-shifting circuits typically have a limited pass-band, in particular a low-pass effect (a high-frequency cut-off), intrinsically due to the construction of the circuit. Thus, a pulse extending over, for example, one clock cycle of the first domain can be filtered out and not pass through the voltage level-shifting circuits.

However, the asynchronous external reset signal can cause the pulse-stretching circuit to reset, interrupting the generation of this pulse, such that the pulse can have a duration that is long enough to be communicated to the voltage level-shifting circuit but that is too short to pass through the voltage level-shifting circuit.

Thus, in such a situation, as regards the first domain, the control signal is effectively communicated to the second domain (at least, communicated to the voltage level-shifting circuit), yet the control signal never reaches the second domain.

There is accordingly a need to prevent such a situation from occurring, and more generally to ensure reliable behavior during the transfer between digital domains, regardless of the time at which an asynchronous external reset occurs.

SUMMARY

According to one aspect, a system-on-a-chip includes: a first digital domain; a second digital domain; and an interface circuit including a level-shifting circuit capable of converting a signal between the first digital domain and the second digital domain; the first digital domain including a control circuit configured to generate a control signal intended for the second digital domain, the control signal including a pulse having a nominal duration that is adapted to the level-shifting circuit; the interface circuit further including, in the first domain at the input of the level-shifting circuit, a conditional pulse-stretching circuit configured to lengthen the duration of the pulse of the control signal to the nominal duration if the duration of the control signal is shorter than the nominal duration and non-zero.

By reference to a "nominal duration that is adapted to the level-shifting circuit" is understood to mean, for example, that the nominal duration corresponds to a frequency that is not filtered out of the limited pass-band of the level-shifting circuit, and that is thus selected to allow said pulse to be communicated to the second digital domain by the level-shifting circuit.

Thus, the conditional pulse-stretching circuit allows any shortening of the pulse of the control signal to be corrected, so as to ensure that the control signal that exists (as it is of non-zero duration) passes through the level-shifting circuit and is effectively communicated to the second digital domain.

The shortening can be caused, for example, by a reset of the control circuit during the incomplete generation of the pulse of the control signal.

Furthermore, the conditional pulse-stretching circuit is advantageously configured so as not to act on the control signal outside the conditions defined hereinabove (i.e., in the absence of the signal (pulse of zero duration)), and if the duration of the control signal is able to pass through the level-shifting circuit (i.e., if the duration is not shorter than the nominal duration).

According to one embodiment, the control circuit is configured to be reset by a first reset signal, whereas the conditional pulse-stretching circuit is configured to not be reset by the first reset signal.

Since the conditional stretching circuit of the interface circuit is not affected by the first reset signal, the conditional stretching circuit will effectively be able to lengthen the duration of the pulse in the event of a reset by the first reset signal during the generation of the pulse by the control circuit. This thus allows the interface circuit to respond in a controlled manner to a reset by the first reset signal, for example in order to complete a transfer without data corruption, with said control signal having the nominal duration, despite a reset occurring at a time when the generation thereof is incomplete.

For example, the first reset signal is an asynchronous external signal, whereas the conditional pulse-stretching circuit is configured to be reset by a second synchronous internal reset signal.

According to one embodiment, the first digital domain includes a clock generator configured to generate a first clock signal, the nominal duration corresponding to a nominal number of cycles of the first clock signal, the conditional pulse-stretching circuit being configured to lengthen said pulse duration, if the number of cycles of the pulse is less than the nominal number and greater than one.

In other words, the pulse duration is counted in integers of cycles of the first clock signal, and the non-zero duration condition of the conditional stretching circuit corresponds to a duration of at least one cycle of the first clock signal.

According to one embodiment, the interface circuit further includes, in the first domain, between the control circuit and the conditional pulse-stretching circuit, a synchronization circuit configured to synchronize the control signal so as to align the synchronized control signal with full cycles of the first clock signal.

Accordingly, the synchronized control signal (i.e., the control signal output from the synchronization circuit) is communicated over durations corresponding to integers of cycles of the first clock signal, in a manner configured for taking into account the conditional stretching circuit.

According to another aspect, a method for transferring a control signal between at least a first digital domain and a second digital domain of a system-on-a-chip comprises: generating, in the first digital domain, a control signal intended for the second digital domain comprising a pulse intended to have a nominal duration that is adapted for a level-shifting circuit capable of converting a signal between the first digital domain and the second digital domain; and, at the input of the level-shifting circuit, lengthening the duration of the pulse of the control signal to the nominal duration if the duration of the control signal is shorter than the nominal duration and non-zero.

According to one implementation, a first reset signal causes a reset of the first domain, but does not cause a reset of a conditional pulse-stretching circuit configured to carry out said lengthening of the pulse duration.

For example, the first reset signal is an asynchronous external signal, whereas a second synchronous internal reset signal causes a reset of the conditional pulse-stretching circuit.

According to one implementation, the nominal duration corresponds to a nominal number of cycles of a first clock signal generated in the first domain, and the method comprises said lengthening of the pulse duration, if the number of cycles of the pulse of the control signal is less than the nominal number and greater than one.

According to one implementation, the method further comprises synchronizing the control signal and aligning the synchronized control signal with full cycles of the first clock signal.

BRIEF DESCRIPTION OF THE DRAWINGS

Other advantages and features of the invention will become apparent upon examining the detailed description of non-limiting embodiments and implementations, and from the accompanying drawings, in which figures.

DETAILED DESCRIPTION

Figure 1:
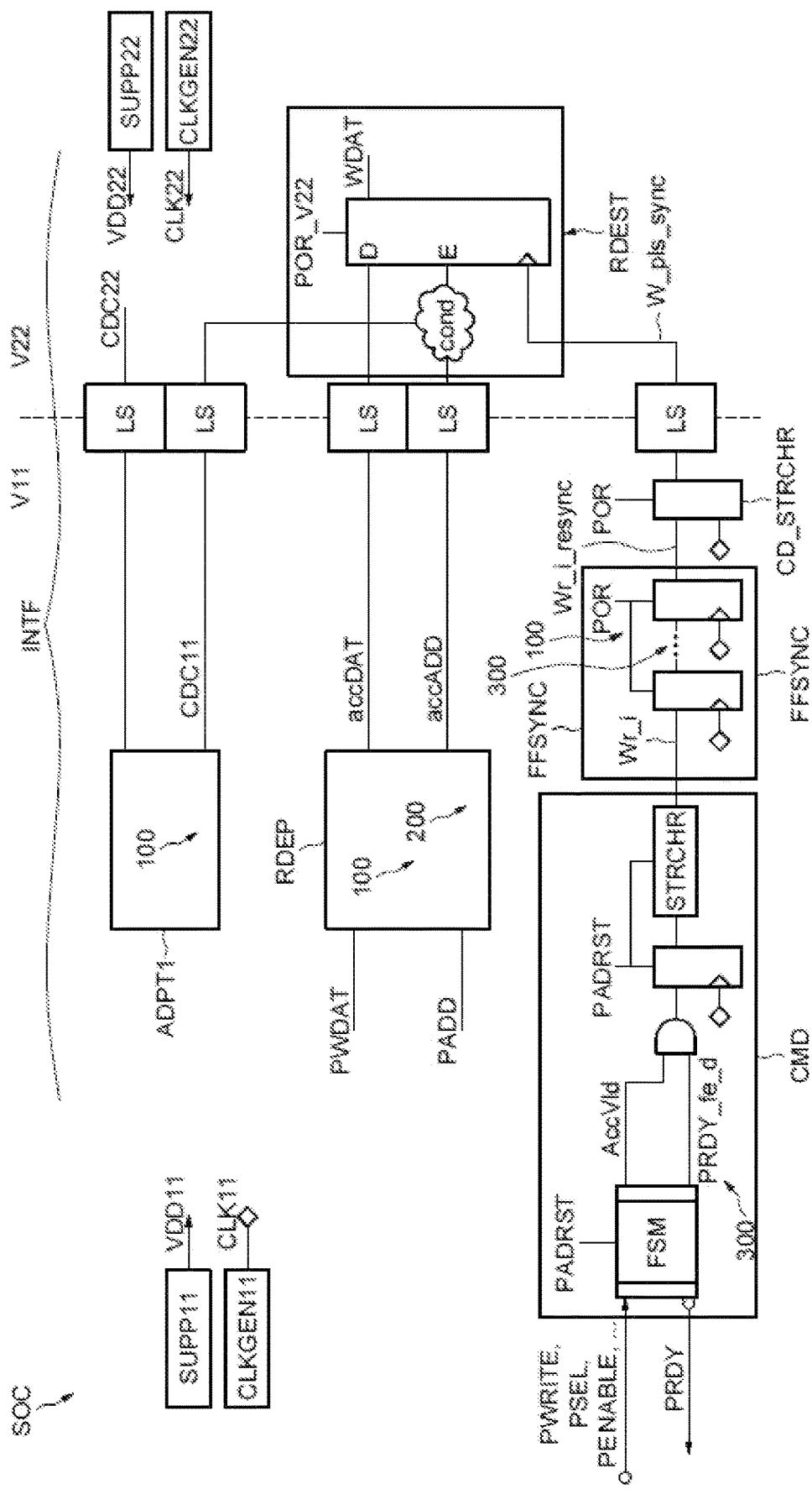
FIG. 1 shows an example of a system-on-a-chip including at least two digital domains with different power supply voltages and different operating frequencies.

FIG. 1 shows an example of a system-on-a-chip SOC including at least two digital domains V11, V22 with different power supply voltages and different operating frequencies.

The first digital domain V11 is supplied with a first power supply voltage VDD11, for example 1.1 volts, generated by a power supply stage SUPP11. The first digital domain V11 is clocked by a first clock signal CLK11 at a first frequency, generated by a clock generation stage CLKGEN11.

The second digital domain V22 is supplied with a second power supply voltage VDD22, for example 3.3 volts, generated by a power supply stage SUPP22. The second digital domain V22 is clocked by a second clock signal CLK22 at a second frequency, generated by a clock generation stage CLKGEN22.

For example, the second frequency is lower than the first frequency, and the second power supply voltage VDD22 is higher than the first power supply voltage VDD11.

In this example, the first domain V11 can, for example, include circuitry configured to perform operations with high performance and consequently high energy consumption, whereas the second domain V22 can, for example, include circuitry configured to be always active, so as to ensure critical operations, and with low energy consumption.

The first domain V11 is configured to be reset by a first reset signal PADRST, or by a second reset signal POR that is different from the first reset signal PADRST. The second domain V22 is configured to be reset by a reset signal POR_V22 specific thereto, but which can also be the same signal as the second reset signal POR of the first domain V11.

The reset signals PADRST, POR (respectively POR_V22) have the effect of placing the digital domain V11 (respectively V22) in a blank and controlled state (typically to restart the domain), and in particular in this respect of interrupting ongoing actions and erasing working data.

In particular, the first reset signal PADRST can come from outside the system-on-a-chip SOC asynchronously with the first clock signal CLK11. For example, the first reset signal PADRST can be a forced reset signal operated by a user independently of the actions being executed by the first domain V11.

The second reset signal POR can be generated during a synchronous reset process upon powering on the system-on-a-chip SOC, usually referred to as a "power-on reset".

The reset signal POR_V22 of the second domain V22 is considered to also be generated internally in a synchronous manner, for example during the reset process upon powering on the system-on-a-chip SOC.

Critical information to be stored in the second domain V22 can be written by initiators from the first domain V11, and in this respect, the system-on-a-chip SOC includes an interface circuit INTF configured to transfer data and signals between the two domains V11, V22.

The interface circuit INTF allows the signals and data from the first domain V11 to be made compatible with the second domain V22, and optionally allows the signals and data from the second domain V22 to be made compatible with the first domain V11, in particular according to the respective voltage-frequency pairs for each domain.

Moreover, the interface circuit INTF protects the potentially critical data from corruption caused by an asynchronous reset that occurs during the transfer. More specifically, an asynchronous reset can cause metastable states in registers. In the metastable state of a register, an output signal oscillates between the high state and the low state for a certain period of time and then converges to a random state.

As regards compatibility between the first power supply voltage VDD11 and the second power supply voltage VDD22, the interface circuit INTF includes level-shifting circuits LS configured to convert the voltages of the logic levels of one of the two domains V11, V22 to the corresponding voltage of the other domain V22, V11.

The level-shifting circuits LS typically have a limited pass-band, in particular with a low-pass effect (i.e., a high-frequency cut-off) intrinsically due to the construction of the level-shifting circuits LS.

Thus, for example, a pulse extending over a nominal duration is able to pass through the level-shifting circuits LS normally without being filtered by the frequency cut-off effect, whereas a pulse extending over a duration that is less than the nominal duration can be filtered by the frequency cut-off effect and not pass through the level-shifting circuits LS.

For example, the nominal duration can correspond to an integer N of cycles of the first clock signal CLK11, whereas a pulse extending over a smaller number of cycles of the first clock signal CLK11 (for example starting at N−1 cycles) would be filtered out and would not pass through the level-shifting circuits LS.

In this context, the phrase "passing through the level-shifting circuits LS" is understood to mean that the pulse is converted and communicated to the second domain V22 (in the case of a transmission of a pulse from the first digital domain V11, to the second digital domain V22); whereas the phrase "not passing through the level-shifting circuits LS" is understood to mean that the pulse is not converted and is not communicated to the second domain V22, due to the limited pass-band of the level-shifting circuits LS.

As regards compatibility between the first frequency CLK11 and the second frequency CLK22, the interface circuit INTF includes, in particular, transfer elements RDEP, ADPT1 in the first domain V11, a synchronization circuit FFSYNC in the first domain V11, a conditional stretching circuit CD_STRCHR in the first domain V11, and a destination register RDEST in the second domain V22.

Thus, the interface circuit INTF includes circuits in the first domain V11 and circuits in the second domain V22; however, not all circuits belonging to the interface circuit INTF are necessarily reset by the reset signal that resets the domain that contains them.

More specifically, the phrase "a circuit in the first domain" is understood to mean that this circuit belongs to the first domain, that it is supplied with the first power supply voltage VDD11 and that the operation thereof is clocked by the first clock signal CLK11, independently of the reset signal affecting these circuits. The phrase "a circuit in the second domain" is understood to mean that this circuit belongs to the second domain, that it is supplied with the second power supply voltage VDD22 and that the operation thereof is clocked by the second clock signal CLK22, independently of the reset signal affecting these circuits.

As a corollary, the phrase "the first domain V11 is configured to be reset by a first reset signal PADRST" is understood to mean that it is the circuits configured for the primary function of the first domain V11 which are affected by the first reset signal PADRST, and not necessarily the circuits belonging to the interface circuit INTF, which are in particular configured for the transfer of information between the first domain V11 and the second domain V22 (which is not the primary function of the first domain V11).

The transfer elements RDEP, ADPT1 of the interface circuit INTF allow for the transfer of data PWDAT, PADD from a starting register RDEP to a destination register RDEST; or allow a handshake process to be established with a handshake signal CDC22 originating from the second domain V22 and sent back to the second domain V22 after passing CDC11 in the first domain V11.

A control circuit CMD belonging to the first domain V11 and configured to be reset by the first reset signal PADRST, generates a control signal Wr_i which is intended to be transmitted to the destination register RDEST in order to control (W_pls_sync) a capture of the transferred data PWDAT, PADD originating from the starting register RDEP.

The control signal Wr_i is then communicated to the level-shifting circuit LS via the synchronization circuit FFSYNC and via the conditional stretching circuit CD_STRCHR.

The synchronization circuit FFSYNC, for transmitting the control signal Wr_i, can include a series of D-type flip-flops, sufficient in number to ensure that the risk of metastability propagation is less than a mean time between failures (MTBF) specification of the system-on-a-chip SOC.

Thus, it should be noted that the control signal Wr_i is resynchronized Wr_i_resync over an integer number of cycles of the first clock signal CLK11, by the synchronization circuit FFSYNC.

As regards protection against corruption caused by an asynchronous reset during the transfer, the interface circuit INTF is, for example, configured to implement measures (also referred to as operations or actions) 100, 200, 300 to ensure that there is no risk of corruption.

In the first measure 100, the transfer elements RDEP, ADPT1, as well as the synchronization circuit FFSYNC and the conditional stretching circuit CD_STRCHR are configured not to be reset by the first reset signal PADRST, unlike the other circuits of the first domain V11.

In the second measure 200, the starting register RDEP is configured to capture the data to be transferred PWDAT, PADD in a single cycle of the first clock signal CLK11, and then store said data accDAT, accADD, for example in a D-type flip-flop, independently of the input channels PWDAT, PADD.

In the third measure 300, the control circuit CMD is configured to generate the control signal Wr_i, which is intended for the destination register RDEST, one cycle of the first clock signal CLK11 after said data has been supplied PWDAT, PADD.

This ensures that data stored accDAT, accADD by the starting register RDEP, which has potentially been corrupted by a reset PADRST occurring during the first cycle of the transfer, is not captured by the destination register RDEST (since the reset PADRST prevents the generation and transmission of the control signal Wr_i, and also without the risk of metastability due to the synchronization circuit FFSYNC).

The control circuit CMD includes a control processing circuit, for example a finite-state machine FSM, for generating the control signal Wr_i. For example, the finite-state machine FSM is able to control the actions of the transfer, and in particular generate the control signal Wr_i, as a function of input signals PWRITE, PSEL, PENABLE, to be taken from an advanced peripheral bus (APB).

Moreover, for example from an operational signal PRDY of the APB protocol, and a cumulative condition between a falling edge of the operational signal shifted by one cycle PRDY_fe_d with an access validity signal AccVld, the triggering time is obtained for the control signal Wr_i whose pulse is initially generated over a single cycle of the first clock signal CLK11 by a D flip-flop clocked by the first clock signal CLK11.

The control signal Wr_i is, for example, ultimately obtained by a pulse-stretching circuit STRCHR, configured to stretch the initial pulse of the control signal to a duration that is long enough to pass through the voltage level-shifting circuit LS, for example a duration of N cycles of the first clock signal CLK11.

A person skilled in the art can, for all intents and purposes concerning the system-on-a-chip SOC and in particular the mechanisms of the interface circuit INTF mentioned hereinabove, refer to U.S. patent application Ser. No. 18/133,214

(corresponding to French Application for Patent No. 2203375 filed Apr. 12, 2022; incorporated herein by reference).

However, if a reset PADRST occurs during the lengthening of the initial pulse, in one of the N−1 cycles following the first cycle, then the duration of the pulse of the control signal Wr_i is truncated and may potentially not pass through the level-shifting circuit LS.

In fact, N cycles of the first clock signal CLK11 are considered to correspond to the nominal duration adapted to the level-shifting circuit LS, if the pulses of the control signal which have a duration that is shorter than N cycles of the first clock signal CLK11 are filtered out by the level-shifting circuit LS, and are not communicated to the second digital domain V22.

In this respect, the interface circuit INTF further includes, in the first domain V11, a conditional pulse-stretching circuit CD_STRCHR at the input of the level-shifting circuit LS, and in this example, at the output of the synchronization circuit FFSYNC. The conditional pulse-stretching circuit CD_STRCHR is configured to lengthen the duration of the pulse of the control signal Wr_i_resync to the nominal duration if the following conditions are true: the effective duration of the control signal Wr_i is shorter than the nominal duration, and the effective duration of the control signal Wr_i is non-zero.

Figure 2:
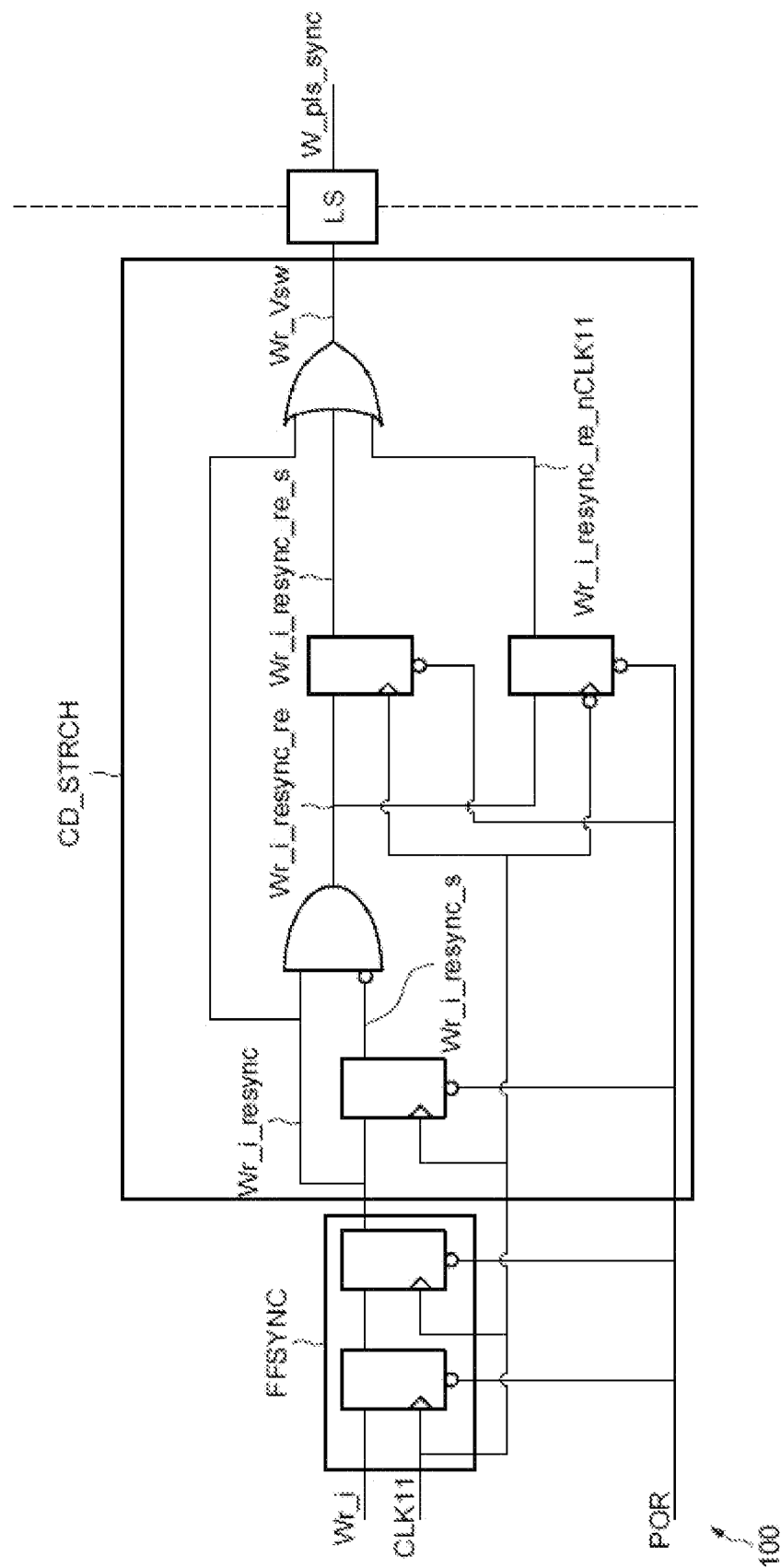
FIG. 2 shows a conditional pulse-stretching circuit at the output of a synchronization circuit.
Figure 3:
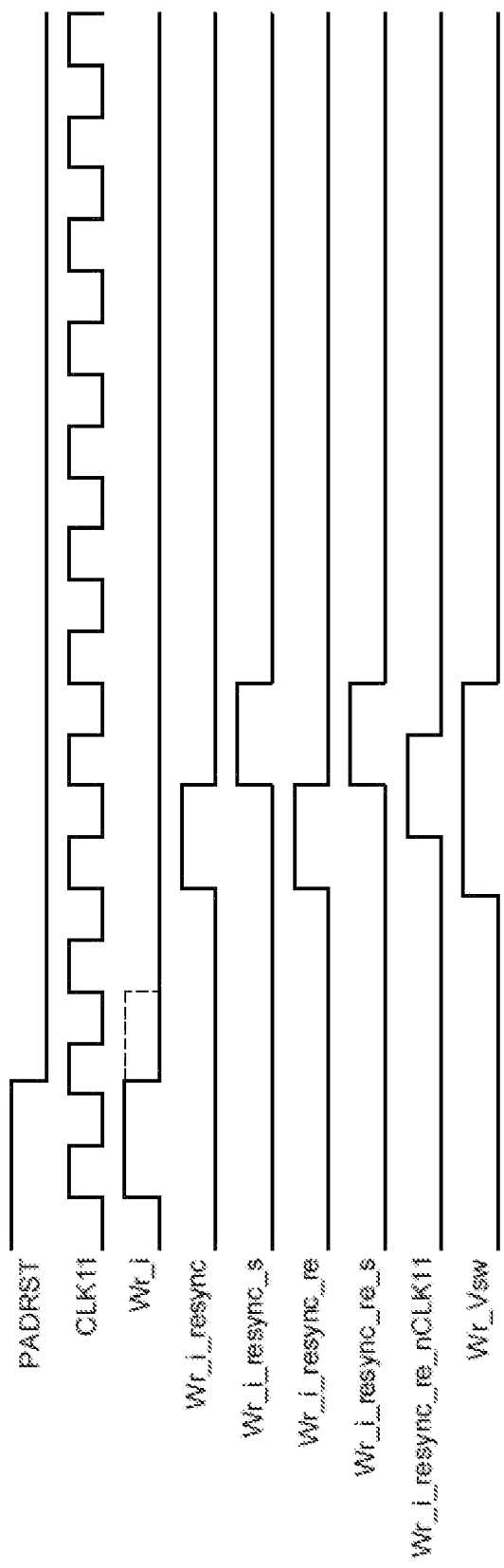
FIG. 3 is a timing diagram showing the internal signal pattern of the operation of the conditional pulse-stretching circuit in FIG. 2.

Reference is made, in this respect, to FIG. 2 and FIG. 3.

FIG. 2 shows an example embodiment of the conditional pulse-stretching circuit CD_STRCHR, at the output of the resynchronization circuit FFSYNC.

FIG. 3 is a timing diagram showing the internal signal pattern of the operation of the conditional pulse-stretching circuit CD_STRCHR in FIG. 2.

The example of the conditional pulse-stretching circuit CD_STRCHR described with reference to FIG. 2 and FIG. 3 corresponds to the particular case where N=2, in an advantageous embodiment with the minimum number of logic gates to ensure the aforementioned conditional function of lengthening the duration of the pulse of the control signal Wr_i_resync to the nominal duration.

The operation described with reference to FIG. 3 corresponds to the case where the first asynchronous reset signal PADRST is activated after the first cycle of the first clock signal CLK11 when generating the pulse Wr_i, and before having completed, at the second ("Nth") cycle of the first clock signal CLK11, said generation of the pulse Wr_i.

Thus, the pulse Wr_i entering the synchronization circuit FFSYNC has a duration of one cycle and a fraction of a cycle of the first clock signal CLK11. Due to the action of at least one of the D flip-flops of the synchronization circuit FFSYNC, the resynchronized control signal Wr_i_resync lasts only one full cycle of the first clock signal CLK11. Furthermore, the resynchronized control signal Wr_i_resync is shifted relative to the control signal Wr_i by a number of cycles corresponding to the number of flip-flops in the synchronization circuit FFSYNC, for example by two cycles.

It should be noted that, in the absence of the conditional pulse-stretching circuit CD_STRCHR, such a situation is not protected by the implementation of the third measure 300, since the reset PADRST occurs after the first cycle, such that the data accDAT, accADD of the starting register RDEP are expected to be captured by the destination register RDEST, yet the duration of the pulse Wr_i is not long enough to pass through the level-shifting circuit LS, and thus said capture RDEST cannot be controlled.

The conditional pulse-stretching circuit CD_STRCHR in this example includes a first D flip-flop clocked by the first clock signal CLK11, a two-input AND gate, one of the inputs whereof is inverted, a second D flip-flop clocked by the first clock signal CLK11, a third D flip-flop clocked by the inverse of the first clock signal CLK11, and a three-input OR gate.

The first D flip-flop is configured to shift the pulse of the resynchronized control signal Wr_i_resync by one CLK11 cycle, in the first outgoing signal Wr_i_resync_s.

The AND gate is configured to generate a pulse Wr_i_resync_re with a duration of one CLK11 cycle from a rising edge of the resynchronized control signal Wr_i_resync, taking as inputs the resynchronized control signal Wr_i_resync and, on the inverted input, the first outgoing signal Wr_i_resync_s.

The second D flip-flop is configured to shift the rising edge pulse Wr_i_resync_re, at the output of the AND gate, by one CLK11 cycle, in the second outgoing signal Wr_i_resync_re_s.

Thus, in such a case, the resynchronized control signal Wr_i_resync and the second outgoing signal Wr_i_resync_re_s last one cycle each and are consecutive.

The resynchronized control signal Wr_i_resync and the second outgoing signal Wr_i_resync_re_s are supplied as inputs to the OR gate.

Thus, the output of the OR gate includes an output pulse Wr_Vsw over said two consecutive cycles of the resynchronized control signal Wr_i_resync and of the second Wr_i_resync_re_s.

It should be noted that in the "normal" case of this example (i.e., when the resynchronized control signal Wr_i_resync is not truncated and lasts for two full cycles (N=2)), then the second outgoing signal Wr_i_resync_re_s is generated at the same time as the second cycle of the resynchronized control signal Wr_i_resync, and the output of the OR gate is identical to the resynchronized control signal Wr_i_resync.

Moreover, the third D flip-flop advantageously allows the rising edge pulse Wr_i_resync_re to be shifted, at the output of the AND gate, by half a CLK11 cycle, in a third outgoing signal Wr_i_resync_re_nCLK11. This is because the third flip-flop is clocked by the inverse of the first clock signal CLK11 and thus on the falling edges of the first clock signal CLK11.

The third outgoing signal Wr_i_resync_re_nCLK11 is supplied as an input to the OR gate, together with the resynchronized control signal Wr_i_resync and the second outgoing signal Wr_i_resync_re_s.

As a result, if there is a misalignment (i.e., a deviation) between the resynchronized control signal Wr_i_resync and the second outgoing signal Wr_i_resync_re_s (that is, for example, caused by a slightly longer propagation delay in the routing of the second outgoing signal Wr_i_resync_re_s), then the output Wr_Vsw will not have an abrupt transition caused by the change in input conditions at the time of said deviation, due to the presence, at the input of the OR gate, of the third outgoing signal Wr_i_resync_re_nCLK11, which is, by construction, constant at that moment in time.

Furthermore, the conditional pulse-stretching circuit CD_STRCHR can advantageously implement the first measure 100 (i.e., the conditional pulse-stretching circuit CD_STRCHR is configured not to be reset by the first reset signal PADRST, unlike the other circuits of the first domain V11).

For example, the conditional pulse-stretching circuit CD_STRCHR can be configured to be reset by the second reset signal POR.

In this respect, all D flip-flops of the conditional pulse-stretching circuit CD_STRCHR are arranged to be reset by the same reset signal POR as the synchronization circuit FFSYNC.

Thus, to summarize, when the first reset signal PADRST occurs after the first cycle, and before the last ("Nth") cycle, of the generation of the pulse of the control signal Wr_i by the stretching circuit STRCHR of the control circuit CMD, the conditional pulse-stretching circuit CD_STRCHR ensures that the pulse will safely pass through the level-shifting circuit LS.

And, when the first reset signal PADRST does not occur during the generation of the pulse of the control signal Wr_i, the conditional pulse-stretching circuit CD_STRCHR has no impact on the shape of the pulse.

The invention claimed is:

1. A system-on-a-chip, comprising:
    a first digital domain;
    a second digital domain; and
    an interface circuit including a level-shifting circuit configured to convert a signal between the first digital domain and the second digital domain;
    wherein the first digital domain includes a control circuit configured to generate a control signal for transmission to the second digital domain, the control signal including a pulse intended to have a nominal duration that is adapted to the level-shifting circuit;
    the interface circuit further including, in the first domain at an input of the level-shifting circuit, a conditional pulse-stretching circuit configured to lengthen a duration of the pulse of the control signal to at least the nominal duration when the duration of the pulse of the control signal is shorter than the nominal duration and non-zero.

2. The system-on-a-chip according to claim 1, wherein the control circuit is configured to be reset by a first reset signal, and wherein the conditional pulse-stretching circuit is configured to not be reset by the first reset signal.

3. The system-on-a-chip according to claim 2, wherein the first reset signal is an asynchronous external signal, and wherein the conditional pulse-stretching circuit is configured to be reset by a second synchronous internal reset signal.

4. The system-on-a-chip according to claim 1, wherein the first digital domain includes a clock generator configured to generate a first clock signal, wherein the nominal duration corresponds to a nominal number of cycles of the first clock signal, wherein the conditional pulse-stretching circuit is configured to lengthen the duration of the pulse when a number of cycles of the first clock signal in the pulse is less than the nominal number and greater than one.

5. The system-on-a-chip according to claim 4, wherein the interface circuit further includes, in the first domain, between the control circuit and the conditional pulse-stretching circuit, a synchronization circuit configured to synchronize the control signal and align the synchronized control signal with full cycles of the first clock signal.

6. A method for transferring a control signal between at least a first digital domain and a second digital domain of a system-on-a-chip, comprising:
    generating, in the first digital domain, a control signal for transmission to the second digital domain comprising a pulse intended to have a nominal duration that is adapted for a level-shifting circuit that converts a signal between the first digital domain and the second digital domain; and
    at an input of the level-shifting circuit, lengthening a duration of the pulse of the control signal to the nominal duration when the duration of the pulse of the control signal is shorter than the nominal duration and non-zero.

7. The method according to claim 6, further comprising resetting the first domain in response to a first reset signal, wherein said first reset signal does not cause a reset of a conditional pulse-stretching circuit configured to carry out said lengthening of the duration of the pulse.

8. The method according to claim 7, wherein the first reset signal is an asynchronous external signal, and further comprising resetting the conditional pulse-stretching circuit in response to a second synchronous internal reset signal.

9. The method according to claim 6, wherein the nominal duration corresponds to a nominal number of cycles of a first clock signal generated in the first domain, and wherein lengthening comprises lengthening of the duration of the pulse when a number of cycles of the first clock signal in the pulse of the control signal is less than the nominal number and greater than one.

10. The method according to claim 9, further comprising synchronizing the control signal and aligning the synchronized control signal with full cycles of the first clock signal.

11. A system-on-a-chip, comprising:
    a first digital domain;
    a second digital domain; and
    an interface circuit including a shift circuit configured to level shift a signal between a first level associated with the first digital domain and a second level associated with the second digital domain;
    wherein the first digital domain includes a control circuit configured to generate a control signal for transmission to the second digital domain, the control signal including a pulse having a duration;
    the interface circuit further including, in the first domain at an input of the shift circuit, a conditional pulse-stretching circuit configured to lengthen the duration of the pulse of the control signal to be at least equal to a nominal duration when the duration of the pulse of the control signal is shorter than the nominal duration and non-zero; and
    wherein said nominal duration corresponds to a frequency that is not filtered out of a limited pass-band of the shift circuit.

12. The system-on-a-chip according to claim 11, wherein the control circuit is configured to be reset by a first reset signal, and wherein the conditional pulse-stretching circuit is configured to not be reset by the first reset signal.

13. The system-on-a-chip according to claim 12, wherein the first reset signal is an asynchronous external signal, and wherein the conditional pulse-stretching circuit is configured to be reset by a second synchronous internal reset signal.

14. The system-on-a-chip according to claim 11, wherein the first digital domain includes a clock generator configured to generate a first clock signal, wherein the conditional pulse-stretching circuit is configured to lengthen the duration of the pulse when a number of cycles of the first clock signal in the pulse is less than a nominal number of cycles and greater than one.

15. The system-on-a-chip according to claim 14, wherein the interface circuit further includes, in the first domain, between the control circuit and the conditional pulse-stretching circuit, a synchronization circuit configured to synchronize the control signal and align the synchronized control signal with full cycles of the first clock signal.

* * * * *